United States Patent
Choi et al.

(10) Patent No.: US 8,963,179 B2
(45) Date of Patent: Feb. 24, 2015

(54) LIGHT EMITTING DEVICE AND LIGHT EMITTING DEVICE PACKAGE

(75) Inventors: Kwang Ki Choi, Seoul (KR); Hwan Hee Jeong, Seoul (KR); Sang Youl Lee, Seoul (KR); June O Song, Seoul (KR); Ji Hyung Moon, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 102 days.

(21) Appl. No.: 13/033,264

(22) Filed: Feb. 23, 2011

(65) Prior Publication Data
US 2011/0220944 A1 Sep. 15, 2011

(30) Foreign Application Priority Data
Mar. 9, 2010 (KR) .................. 10-2010-0020755

(51) Int. Cl.
| H01L 33/40 | (2010.01) |
| H01L 33/44 | (2010.01) |
| H01L 33/22 | (2010.01) |
| H01L 33/42 | (2010.01) |
| B82Y 20/00 | (2011.01) |

(52) U.S. Cl.
CPC .............. *H01L 33/42* (2013.01); *H01L 33/22* (2013.01); *B82Y 20/00* (2013.01); *H01L 33/40* (2013.01); *H01L 33/44* (2013.01)
USPC .. 257/98; 257/99; 257/E33.067; 257/E33.068

(58) Field of Classification Search
None
See application file for complete search history.

(56) References Cited

U.S. PATENT DOCUMENTS

| 5,717,226 | A  | * | 2/1998  | Lee et al. ........................ 257/86 |
| 7,514,717 | B2 | * | 4/2009  | Chen .............................. 257/79 |
| 8,237,673 | B2 | * | 8/2012  | Jiang et al. ..................... 345/173 |
| 2004/0113166 | A1 | * | 6/2004 | Tadatomo et al. ............. 257/98 |
| 2005/0199894 | A1 | * | 9/2005 | Rinzler et al. ................. 257/94 |
| 2007/0145381 | A1 | * | 6/2007 | Unno et al. .................... 257/79 |
| 2008/0006820 | A1 |   | 1/2008  | Schols et al. .................. 257/40 |
| 2008/0029773 | A1 | * | 2/2008 | Jorgenson ...................... 257/94 |
| 2008/0048206 | A1 | * | 2/2008 | Lee et al. ....................... 257/103 |
| 2008/0135864 | A1 | * | 6/2008 | David et al. .................... 257/98 |
| 2009/0087950 | A1 |   | 4/2009  | Cho et al. ....................... 438/113 |
| 2009/0166666 | A1 |   | 7/2009  | Yao et al. ....................... 257/101 |
| 2009/0257466 | A1 | * | 10/2009 | Eberhard et al. ............ 372/45.01 |
| 2009/0275852 | A1 |   | 11/2009 | Oki et al. ....................... 600/532 |

(Continued)

FOREIGN PATENT DOCUMENTS

| DE | 102008038725 A1 * | 2/2010 | ............. H01L 33/00 |
| JP | 2002-313582 A | 10/2002 | |

(Continued)

OTHER PUBLICATIONS de los Arcos et al., "Optical characterization of alignment and effective refractive index in carbon nanotube films", Nanotechnology 18, 265706 ( 5pp.) (2007).*

(Continued)

*Primary Examiner* — Johannes P Mondt
(74) *Attorney, Agent, or Firm* — KED & Associates, LLP

(57) ABSTRACT

Disclosed are a light emitting device and a light emitting device package. The light emitting device includes a first electrode, a light emitting structure including a first semiconductor layer, an active layer, and a second semiconductor layer on the first electrode, a nano-tube layer including a plurality of carbon nano tubes on the light emitting structure, and a second electrode on the light emitting structure.

13 Claims, 14 Drawing Sheets

(56) References Cited

U.S. PATENT DOCUMENTS

| | | | |
|---|---|---|---|
| 2009/0302749 A1 | 12/2009 | Lee et al. | 313/504 |
| 2010/0038669 A1* | 2/2010 | McKenzie | 257/98 |
| 2010/0051994 A1* | 3/2010 | Katsuno et al. | 257/98 |
| 2011/0001161 A1 | 1/2011 | Park et al. | 257/98 |
| 2014/0327032 A1 | 11/2014 | Park et al. | 257/99 |

FOREIGN PATENT DOCUMENTS

| | | | | |
|---|---|---|---|---|
| JP | 2007-523495 | | 8/2007 | |
| JP | 2008-282966 | | 11/2008 | |
| JP | 2009-206265 | | 9/2009 | |
| JP | 2009-283303 | A | 12/2009 | |
| KR | 10-2004-0043900 | A | 5/2004 | |
| KR | 10-2007-0026389 | A | 3/2007 | |
| KR | 10-2008-0018084 | A | 2/2008 | |
| KR | 10-2009-0032631 | A | 4/2009 | |
| KR | 10-2009-0032831 | | 4/2009 | |
| WO | WO-2009010762 A1 | * | 1/2009 | H01L 33/00 |
| WO | WO 2010/011074 | | 1/2010 | |

OTHER PUBLICATIONS

Korean Office Action dated Feb. 7, 2011 issued in Application No. 10-2010-0020755.

U.S. Office Action issued in co-pending U.S. Appl. No. 14/486,364 dated Dec. 11, 2014.

Chien et al., "A solution processed top emission OLED with transparent carbon nanotube electrodes," Nanotechnology 21 (2010) 134040 (5pp) IOP publ.

Japanese Office Action issued in related Application No. 2011-050166 dated Dec. 4, 2014.

* cited by examiner

LIGHT EMITTING DEVICE AND LIGHT EMITTING DEVICE PACKAGE

The present application claims priority of Korean Patent Application No. 10-2010-0020755 filed on Mar. 9, 2010, which is hereby incorporated by reference in its entirety.

BACKGROUND

The embodiment relates to a light emitting device and a light emitting device package.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device having a novel structure and a light emitting device package.

The embodiment provides a light emitting device capable of improving light extraction efficiency.

According to the embodiment, a light emitting device includes a light emitting structure including a first semiconductor layer, an active layer, and a second semiconductor layer, a nano-tube layer including carbon nano tubes on the light emitting structure, a first electrode on one of the first and second semiconductor layers, and a second electrode on the other of the first and second semiconductor layers.

According to the embodiment, a light emitting device includes a first electrode including a support member having conductivity, a light emitting structure including a first semiconductor layer, an active layer, and a second semiconductor layer on the first electrode, a nano-tube layer on the second semiconductor layer to partially expose the second semiconductor layer, and a second electrode on at least one of the second semiconductor layer and the nano-tube layer.

According to the embodiment, a light emitting device includes a substrate, a light emitting structure including a first semiconductor layer, an active layer, and a second semiconductor layer on the substrate, a first electrode on the first semiconductor layer, a nano tube layer on the second semiconductor layer, a second electrode on the nano tube layer, a passivation layer surrounding the light emitting structure, and a current blocking layer between the second semiconductor layer and the nano tube layer corresponding to the second electrode.

DETAILED DESCRIPTION OF THE EMBODIMENTS

Figure 1:
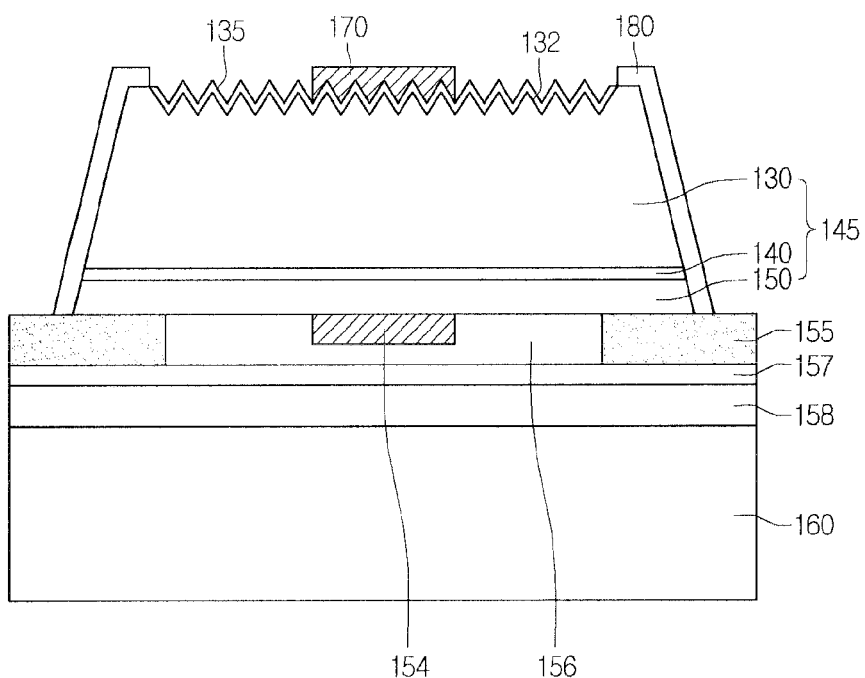
FIG. 1 is a side sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a side sectional view showing a light emitting device 100 according to a first embodiment.

Referring to FIG. 1, the light emitting device 100 according to the first embodiment includes a first electrode 160, an adhesive layer 158 on the first electrode 160, a reflective layer 157 on the adhesive layer 158, a protection layer 155 on an outer peripheral portion of a top surface of the reflective layer 157, an ohmic contact layer 156 on the reflective layer 157, a light emitting structure 145 formed on the ohmic contact layer 156 and the protection layer 155 to generate light, a nano-tube layer 135 on a top surface of the light emitting structure 145, a passivation layer 180 on a lateral surface of the light emitting structure 145, and a second electrode 170 on the nano-tube layer 135.

The first electrode 160 not only supports a plurality of layers thereon, but acts as an electrode. In other words, the first electrode 160 may include a support member having conductivity. The first electrode 160 may supply power to the light emitting structure 145 together with the second electrode 170.

The first electrode 160 may include at least one selected from the group consisting of titan (Ti), chromium (Cr), nickel (Ni), aluminum (Al), platinum (Pt), gold (Au), tungsten (W), copper (Cu), molybdenum (Mo), copper-tungsten (Cu—W), and a carrier wafer (including Si, Ge, GaAs, ZnO, SiC, SiGe, or GaN).

The thickness of the first electrode 160 may vary according to the design of the light emitting device 100. For example, the thickness of the first electrode 160 may be in the range of about 30 μm to about 500 μm.

The first electrode 160 may be plated and/or deposited under the light emitting structure 145, or may be attached in the form of a sheet, but the embodiment is not limited thereto.

The adhesive layer 158 may be formed on the first electrode 160. The adhesive layer 158 acts as a bonding layer and is formed under the reflective layer 157. The adhesive layer 158 contacts the reflective layer 157 to enhance adhesive strength between the reflective layer 157 and the first electrode 160.

The adhesive layer 158 may include barrier metal or bonding metal. For example, the adhesive layer 158 may include at least one selected from the group consisting of Ti, Au, Sn, Ni, Cr, Ga, In, Bi, Cu, Ag, and Ta.

However, if the first electrode 160 is formed through a plating scheme or a deposition scheme instead of a bonding scheme, the adhesive layer 158 may not be formed.

The reflective layer 157 may be formed on the adhesive layer 158. The reflective layer 157 reflects light incident from the light emitting structure 145 to improve the light emission efficiency of the light emitting device 100.

The reflective layer 157 may include a material having high reflectance. The reflective layer 157 may include at least one selected from the group consisting of Ag, Ni, Al, Rh, Pd, Ir, Ru, Mg, Zn, Pt, Au, and Hf, or an alloy including at least two of the above materials, but the embodiment is not limited thereto. The reflective layer 157 may have a multiple layer structure including a transparent conductive material such as IZO (In—ZnO), GZO (Ga—ZnO), AZO (Al—ZnO), AGZO (Al—Ga—ZnO), IGZO (In—Ga—ZnO), IZTO (indium zinc tin oxide), IAZO (indium aluminum zinc oxide), IGTO (indium gallium tin oxide), or ATO (aluminum tin oxide) together with the metal. For example, the reflective layer 157 may have a multiple layer structure layer such as IZO/Ni, AZO/Ag, IZO/Ag/Ni, or AZO/Ag/Ni.

The protection layer 155 may be formed on an outer peripheral portion of the top surface of the reflective layer 157. In other words, the protection layer 155 may be formed on an outer peripheral portion among the light emitting structure 145, the ohmic contact layer 156, and the reflective layer 157.

The protection layer 155 may include an electrical insulating material or a material having electrical conductivity lower than that of the light emitting structure 145. For example, the protection layer 155 may include at least one selected from the group consisting of $SiO_2$, $Si_xO_y$, $Si_3N_4$, $Si_xN_y$, $SiO_xN_y$, $Al_2O_3$, and $TiO_2$. In this case, the protection layer 155 may prevent the light emitting structure 145 from being electrically shorted with the first electrode 160, so that the reliability for the light emitting device 100 can be improved.

The protection layer 155 may include a metallic material representing superior adhesive strength. For example, the protection layer 155 may include at least one selected from the group consisting of Ti, Ni, Pt, Pd, Rh, Ir and W. In this case, the protection layer 155 enhances the adhesive strength between the light emitting structure 145 and the reflective layer 157, so that the reliability for the light emitting device 100 can be improved. The protection layer 155 is not broken so that fragments do not occur in a laser scribing process to divide a plurality of chips in the unit of an individual chip and an LLO (LLO) process to remove the substrate when performing a chip separation process. Accordingly, the reliability for the light emitting device 100 can be improved. In addition, when the protection layer 155 makes ohmic contacts with the first conductive semiconductor layer 150, current flows through the protection layer 155. Accordingly, the active layer 149 overlapping with the protection layer 155 in a perpendicular direction may generate light, so that the light emission efficiency of the light emitting device 100 can be more improved. For example, if the first conductive semiconductor layer 150 is a P type semiconductor layer, the protection layer 155 may include Ti, Ni, or W making ohmic contact with respect to the P type semiconductor, but the embodiment is not limited thereto.

The ohmic contact layer 156 makes ohmic contact with a first conductive semiconductor layer 150 of the light emitting structure 145, so that power can be smoothly supplied to the light emitting structure 145.

In detail, the ohmic contact layer 156 may selectively include transparent conductive material or metal. The ohmic contact layer 156 may be realized in a single layer structure or a multiple layer structure by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au, and Ni/IrOx/Au/ITO.

Meanwhile, if the reflective layer 157 makes ohmic contact with the light emitting structure 145, the ohmic contact layer 156 may be not formed.

A CBL (current blocking layer) 154 may be formed on the ohmic contact layer 156 such that the ohmic contact layer 156 contacts the first conductive semiconductor layer 150. At least a part of the CBL 154 may overlap with the second electrode 170 in a vertical direction. The CBL 154 blocks current supplied to the first conductive semiconductor layer 150 through the ohmic contact layer 156. Accordingly, current can be blocked from being supplied to the first conductive semiconductor layer 150 at the CBL 154 and in the vicinity of the CBL 154. In other words, the CBL 154 blocks current from being concentrated along the shortest path between the first electrode 160 and the second electrode 170 as much as possible. In contrast, the current flows to a region between the ohmic contact layer 156 and the first conductive semiconductor layer 150 other than the CBL 154, so that the current can uniformly flow throughout the whole region of the first conductive semiconductor layer 150. Accordingly, the light emission efficiency can be remarkably improved.

Although current is prevented from flowing along the shortest path between the first electrode 160 and 170 by the CBL 154, current flowing through the peripheral portion of the CBL 154 flows on the shortest path between the first and second electrodes 160 and 170 in the first conductive semiconductor layer 150 adjacent to the CBL 154. Accordingly, the amount of current flowing through the shortest path between the first electrode 160 and the second electrode 170 may be similar or identical to the amount of current flowing in the first conductive semiconductor layer 150 through other current paths.

The CBL 154 may include a material having electrical conductivity lower than that of the ohmic contact layer 156 or an electrical insulating property, or forming schottky contact with respect to the first conductive layer 150. For example, the CLB 154 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr.

Meanwhile, the CBL 154 may be disposed between the ohmic contact layer 156 and the first conductive semiconductor layer 150, or disposed between the reflective layer 157 and the ohmic contact layer 156, but the embodiment is not limited thereto.

In addition, the CBL 154 may be formed inside a recess formed in the ohmic contact layer 156, protrude from the ohmic contact layer 156, or be formed inside a hole passing from a top surface of the ohmic contact layer 156 to the bottom surface thereof, but the embodiment is not limited thereto.

The CBL 154 prevents current from being concentrated on the shortest path between the first and second electrodes 160 and 170, so that the light emission efficiency of the light emitting device 100 can be improved.

The light emitting structure 145 may be formed on both of the ohmic contact layer 156 and the protection layer 155.

The light emitting structure 145 may include a plurality of compound semiconductor materials of group III to V elements.

The light emitting structure 145 may include a first conductive semiconductor layer 150, an active layer 140 on the first conductive semiconductor layer 150, and a second conductive semiconductor layer 130 on the active layer.

The first conductive semiconductor layer 150 may be formed on a part of the protection layer 155, the ohmic contact layer 156, and the CBL 154. The first conductive semiconductor layer 150 may include a P type semiconductor layer including P type dopants. The P type semiconductor layer may include a compound semiconductor material of group III to V elements. For example, the P type semiconductor layer may include one selected from the group consisting of GaN, AlN, AlGaN, InGaN, InN, InAlGaN, AlInN, AlGaAs, GaP, GaAs, GaAsP and AlGaInP. The P type dopant may include Mg, Zn, Ga, Sr, or Ba. The first conductive semiconductor layer 150 may have a single layer structure or a multiple layer structure, but the embodiment is not limited thereto.

The first conductive semiconductor layer 150 supplies a plurality of carriers to the active layer 140.

The active layer 140 is formed on the first conductive semiconductor layer 150, and may include one of a single quantum well structure, a multiple quantum well (MQW) structure, a quantum wire structure or a quantum dot structure, but the embodiment is not limited thereto.

If the active layer 140 has a quantum well structure, the active layer 140 may have a single quantum well structure having a well layer having a compositional formula of $In_xAl_yGa_{1-y}N$ ($0 \leq x \leq 1$, $0 \leq y \leq 1$, $0 \leq x+y \leq 1$), and a barrier layer having a compositional formula of $In_aAl_bGa_{1-a-b}N$ ($0 \leq a \leq 1$, $0 \leq b \leq 1$, $0 \leq a+b \leq 1$). The well layer may include a material having energy bandgap lower than that of the barrier layer.

The active layer 140 may have the stack structure of a well layer and a barrier layer including compound semiconductor materials of group III to V elements. The compound semiconductor materials constituting the active layer 140 may include GaN, InGaN, or AlGaN. Therefore, the active layer 140 may include the stack structure of InGaN well/GaN barrier layers, InGaN well/AlGaN barrier layers, or InGaN well/InGaN barrier layers, but the embodiment is not limited thereto.

The active layer 140 may generate light having a wavelength corresponding to the bandgap determined according to the semiconductor material of the active layer 140 through the recombination of the electrons and the holes provided from the first and second conductive semiconductor layers 112 and 116.

Although not shown, a conductive clad layer may be formed on and/or under the active layer 140. The clad layer may include an AlGaN-based semiconductor. For example, a P type clad layer doped with P type dopants is disposed between the first conductive semiconductor layer 150 and the active layer 140, and an N type clad layer doped with N type dopants may be disposed between the active layer 140 and the second conductive semiconductor layer 130.

The conductive clad layer prevents plural holes and electrodes supplied to the active layer 140 from transferring to the first and second conductive semiconductor layers 150 and 130. Accordingly, a greater amount of holes and electrons supplied to the active layer 140 are recombined with each other due to the conductive clad layer, so that the light emission efficiency of the light emitting device 100 can be improved.

The second conductive semiconductor layer 130 may be formed on the active layer 140. The second conductive semiconductor layer 130 may include an N type semiconductor layer including N type dopants. The second conductive semiconductor layer 130 may include compound semiconductor materials of group III to V elements. For example, the second conductive semiconductor layer 130 may include one selected from the group consisting of GaN, AlN, AlGaN, InGaN, InN, InAlGaN, AlInN, AlGaAs, GaP, GaAs, GaAsP, and AlGaInP. The N type dopant may include Si, Ge, Sn, Se, or Te. The second conductive semiconductor layer 130 may have a single layer structure or a multiple layer structure, but the embodiment is not limited thereto.

A roughness structure 132 may be formed on the top surface of the second conductive semiconductor layer 130 to improve light extraction efficiency. The roughness structure 132 may be a random pattern formed through a wet etching process or a periodical pattern such as a photonic crystal structure formed through a patterning process, but the embodiment is not limited thereto.

The roughness structure 132 may periodically have concave and convex shapes. The concave and convex shapes may have a rounded surface or two opposite inclined surfaces convergent at a vertex.

For example, the roughness structure 132 may have a photonic crystal structure to selectively transmit or reflect light having a specific wavelength band. The roughness structure 132 may have a period of about 50 nm to about 3000 nm, but the embodiment is not limited thereto.

Meanwhile, a semiconductor layer having a polarity opposite to that of the first conductive semiconductor layer 150 may be formed under the first conductive semiconductor layer 150. The first conductive semiconductor layer 150 may include a P type semiconductor layer, and the second conductive semiconductor layer 130 may include an N type semiconductor layer. In contrast, the first conductive semiconductor layer 150 may include an N type semiconductor layer, and the second conductive semiconductor layer 130 may include a P type semiconductor layer. Accordingly, the light emitting structure 145 may have at least one of an N—P junction structure, a P—N junction structure, an N—P—N junction structure, and a P—N—P junction structure.

The nano-tube layer 135 including CNTs (Carbon Nano Tubes) may be formed on the top surface of the second conductive semiconductor layer 130 of the light emitting structure 145.

The carbon nano tube is a nano-size carbon structure having the shape of a tube formed by linking hexagons consisting of six carbons with each other. The carbon nano tube represents high electrical conductivity and thermal conductivity, and has a transparent optical property. The carbon nano tube may be formed through at least one of an Arc-discharge scheme, a laser vaporization scheme, a plasma enhanced chemical vapor deposition scheme, a thermal chemical vapor deposition scheme, a vapor phase growth scheme, an electrolysis scheme, and a flame synthetic scheme, but the embodiment is not limited thereto.

The nano-tube layer 135 may be formed by coating a plurality of carbon nano tubes on the light emitting structure 145, or may be prepared in the form of a film and attached to the light emitting structure 145.

For example, the nano-tube layer 135 may be a thin film having a thickness in the range of about 10 nm to about 10 µm. The nano-tube layer 135 may have a pattern according to the shape of the roughness structure 132 formed on the top surface of the second conductive semiconductor layer 130.

Since the nano-tube layer 135 is formed on the top surface of the light emitting structure 145 and has high electrical conductive, the nano-tube layer 135 uniformly spreads current to the light emitting structure 145, so that current can be prevented from being concentrated on the second electrode 170 and the peripheral portion of the second electrode 170. Accordingly, the light extraction efficiency of the light emitting device 100 can be improved. To maximize the spreading of current, preferably, the nano-tube layer 135 has to be formed at an area corresponding to at least 70% of a area of a top surface of the light emitting structure 145 or must have a predetermined pattern, but the embodiment is not limited thereto.

Since the nano-tube layer 135 has high thermal conductivity, heat emitted from the light emitting structure 145 may be effectively dissipated to the outside.

Although the nano-tube layer 135 is transparent optically, since the refractive index of the nano-tube layer 135 may be less than that of the light emitting structure 145, the light extraction efficiency can be improved due to the refractive index difference.

Since the nano-tube layer 135 allows current to be smoothly supplied to both of a semiconductor and metal, the nano-tube layer 135 may reduce the contact resistance between the second electrode 170 and the second conductive layer 130.

The passivation layer 180 may be formed on at least a lateral surface of the light emitting structure 145. In detail, one end of the passivation layer 180 is formed at an outer peripheral portion of a top surface of the second conductive semiconductor layer 130, and an opposite end of the passivation layer 180 may extend to a top surface of the protection layer 155 by passing or crossing through the lateral surface of the light emitting structure 145, but the embodiment is not limited thereto. In other words, the passivation layer 180 may extend from the top surface of the protection layer 155 to the outer peripheral portion of the top surface of the second conductive semiconductor layer 130 through the lateral surfaces of the first conductive semiconductor layer 150, the active layer 140, and the second conductive semiconductor layer 130.

The passivation layer 180 may prevent the light emitting structure 145 from being electrically shorted with a conductive member such as an external electrode. For example, the passivation layer 180 may include an insulating material including $SiO_2$, $SiO_x$, $SiO_xN_y$, $Si_3N_4$, $TiO_2$, or $Al_2O_3$, but the embodiment is not limited thereto.

The second electrode 170 may be formed on the nano-tube layer 135.

The second electrode 170 may have a single layer structure or a multiple layer structure including at least one selected from the group consisting of Au, Ti, Ni, Cu, Al, Cr, Ag and Pt.

Hereinafter, the method of manufacturing the light emitting device according to the first embodiment will be described in detail.

FIGS. 2 to 11 are views showing the manufacturing process of the light emitting device according to the first embodiment.

Figure 2:
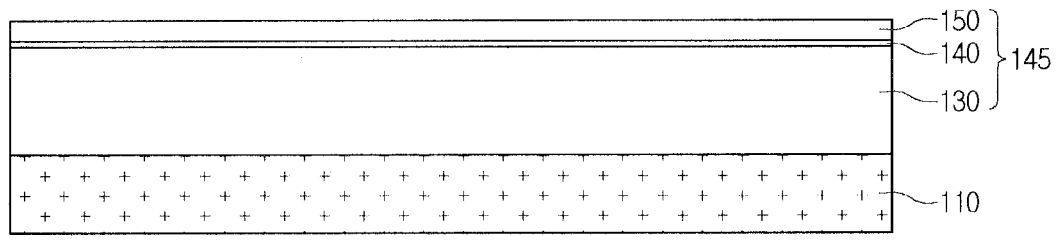
FIGS. 2 to 11 are view showing the manufacturing process of the light emitting device according to the first embodiment.

Referring to FIG. 2, the light emitting structure 145 may be formed on a growth substrate 110.

For example, the growth substrate 110 may include at least one selected from the group consisting of sapphire ($Al_2O_3$), SiC, GaAs, GaN, ZnO, Si, GaP, InP and Ge, but the embodiment is not limited thereto.

The second conductive semiconductor layer 130, the active layer 140, and the first conductive semiconductor layer 150 are sequentially grown from the growth substrate 110, thereby forming the light emitting structure 145.

For example, the light emitting structure 145 may be formed through one of an MOCVD (Metal Organic Chemical Vapor Deposition) scheme, a CVD (Chemical Vapor Deposition) scheme, a PECVD (Plasma-Enhanced Chemical Vapor Deposition) scheme, an MBE (Molecular Beam Epitaxy) scheme, and an HVPE (Hydride Vapor Phase Epitaxy) scheme, but the embodiment is not limited thereto.

Meanwhile, a buffer layer (not shown) or an undoped semiconductor layer (not shown) may be additionally formed between the light emitting structure 145 and the growth substrate 110 to reduce lattice constant mismatch between the light emitting structure 145 and the growth substrate 110.

The buffer layer may include one selected from the group consisting of InAlGaN, GaN, AlGaN, InGaN, AlInN, AlN, and InN, but the embodiment is not limited thereto.

Figure 3:
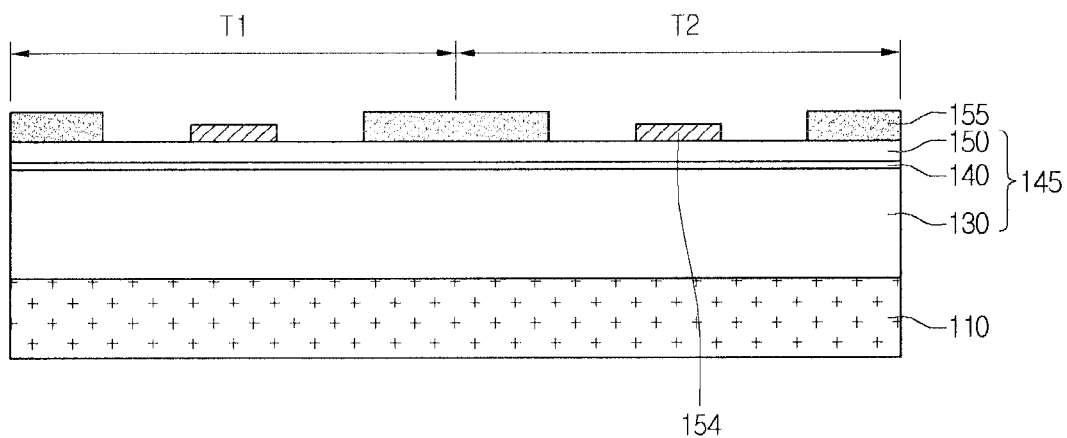

Referring to FIG. 3, the protection layer 155 and the CBL 154 may be formed on the top surface of the light emitting structure 145.

The protection layer 155 may be formed at a chip boundary region, that is, a boundary region between first and second chips T1 and T2 on the first conductive semiconductor layer 150. Thereafter, the first and second chip regions T1 and T2 may be subject to a scribing process so that the first and second chip regions T1 and T2 are separated from each other, thereby manufacturing a unit light emitting device. Accordingly, each chip region T1 or T2 may be defined as a region for the acquisition of a unit light emitting device.

The protection layer 155 may be formed in the vicinity of a boundary region between the first and second chip regions T1 and T2 by using a mask pattern. Since FIG. 3 is a 2-D sectional view, FIG. 3 shows that the protection layer 155 is formed in the vicinity of only the boundary region between the first and second chip regions T1 and T2. However, actually, the protection layer 155 may be formed in the vicinity of all boundary regions between one chip region and all chip regions adjacent to the chip region. When viewed in a plan view, the protection layer 155 may have a ring shape, a loop shape, or a frame shape. The protection layer 155 may be formed through various deposition schemes such as a sputtering scheme, an E-beam deposition scheme, and a PECVD (Plasma Enhanced Chemical Vapor Deposition) scheme.

The protection layer 155 prevents the light emitting structure 145 from being electrically shorted with the first electrode 160, or enhances the adhesive strength between the light emitting structure 145 and the reflective layer 570, so that the reliability for the light emitting device 100 can be improved.

The CBL 154 may be formed on the first conductive semiconductor layer 150, at least a part of which perpendicularly overlaps with the second electrode 170 to be formed in the post process.

The CBL 154 and the protection layer 155 may include the same material and may be simultaneously formed through the same process, or may include different materials and may be formed separately from each other.

The CBL 154 may have a thickness thinner than that of the protection layer 155. In other words, a top surface of the protection layer 155 may be higher than the top surface of the CBL 154.

The CBL 154 and the protection layer 155 may be formed through a deposition scheme or a plating scheme.

The protection layer 155 and the CBL 154 may have an electrical insulating property or may include a material making schottky contact with respect to the first conductive semiconductor layer 150. In other words, the protection layer 155 and the CBL 154 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr.

Figure 4:
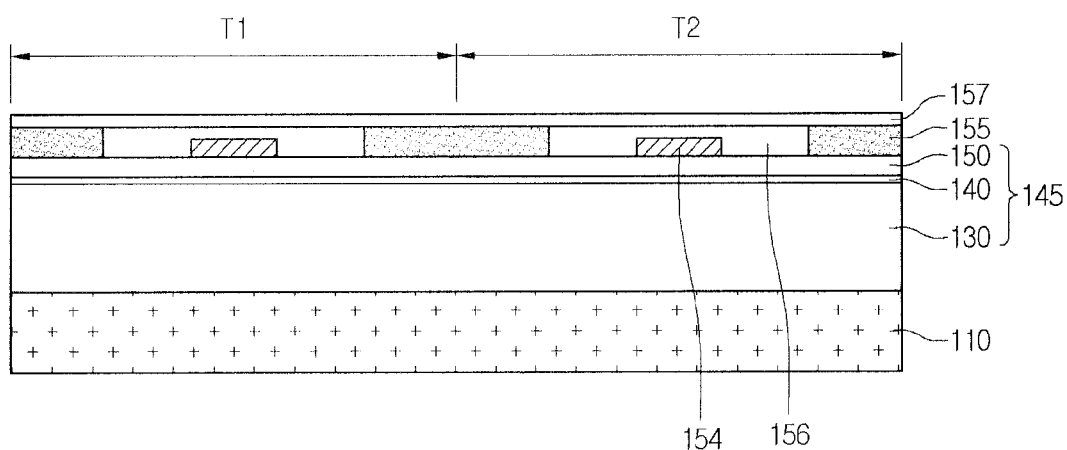

Referring to FIG. 4, the ohmic contact layer 156 is formed on the first conductive semiconductor layer 150 and the CBL 154, and the reflective layer 157 may be formed on the ohmic contact layer 156 and the protection layer 155.

The CBL 154 is configured to fill the ohmic contact layer 156.

The ohmic contact layer 156 and the reflective layer 157 may be formed one of an E-beam deposition scheme, a sputtering scheme, and a PECVD (Plasma Enhanced Chemical Vapor Deposition) scheme.

Figure 5:
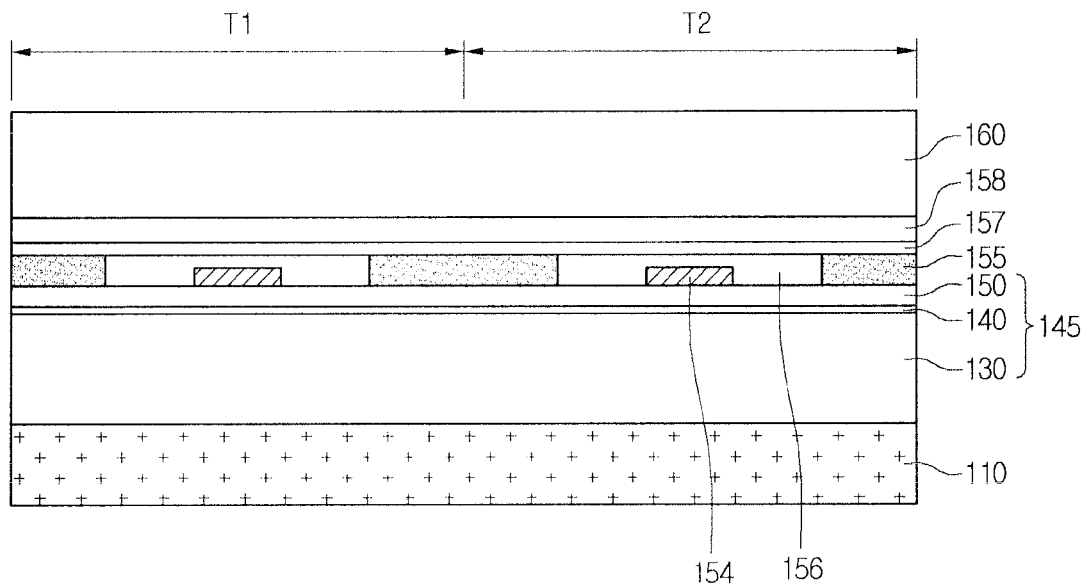

Referring to FIG. 5, the adhesive layer 158 may be formed on the reflective layer 157, and the first electrode 160 may be formed on the adhesive layer 158.

The first electrode 160 may be firmly bonded by the adhesive layer 158. Meanwhile, if the first electrode 160 is formed through a deposition scheme or a plating scheme, the adhesive layer 158 may be not formed.

Figure 6:
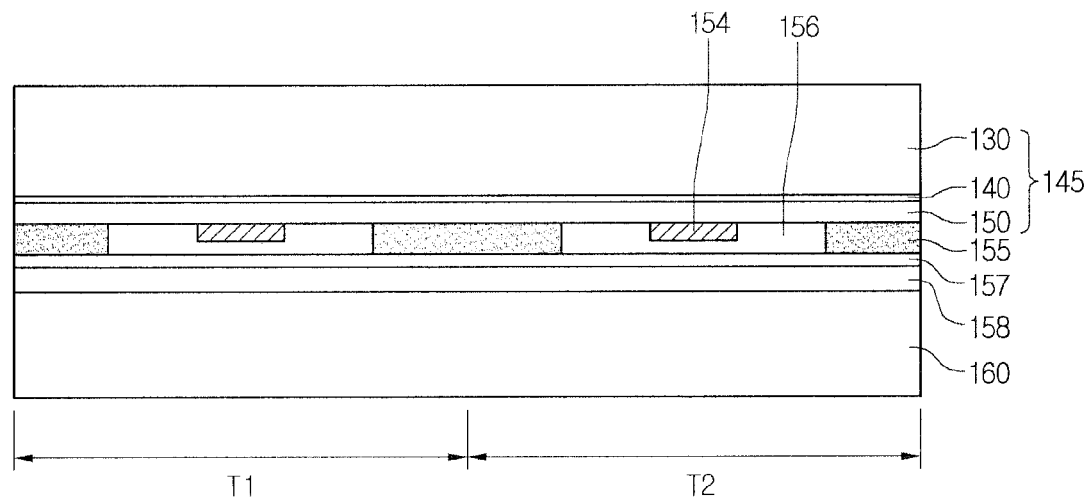

Referring to FIG. 6, after turning the substrate 110 at 180 degrees, the growth substrate 110 may be removed.

The growth substrate 110 may be removed through at least one of an LLO (Laser Lift Off) scheme, a CLO (Chemical Lift Off) scheme, and a physical grinding scheme.

The LLO process is to irradiate a laser beam to the interface between the growth substrate 110 and the second conductive semiconductor layer 130, so that the substrate 110 can be separated from the second conductive semiconductor layer 130.

The chemical etching process includes a wet etching process to remove the substrate 110 such that the second conductive semiconductor layer 130 is exposed.

The growth substrate 110 is sequentially ground from a top surface by using a physical grinder so that the second conductive semiconductor layer 130 is exposed.

A cleaning process may be additionally performed to remove residues of the substrate 110 remaining on the top surface of the second conductive semiconductor layer 130 after removing the substrate 110. The cleaning process may include plasma treatment or an ashing process using oxygen or nitrogen.

As the growth substrate 110 is removed, the top surface of the second conductive semiconductor layer 130 can be exposed.

Figure 7:
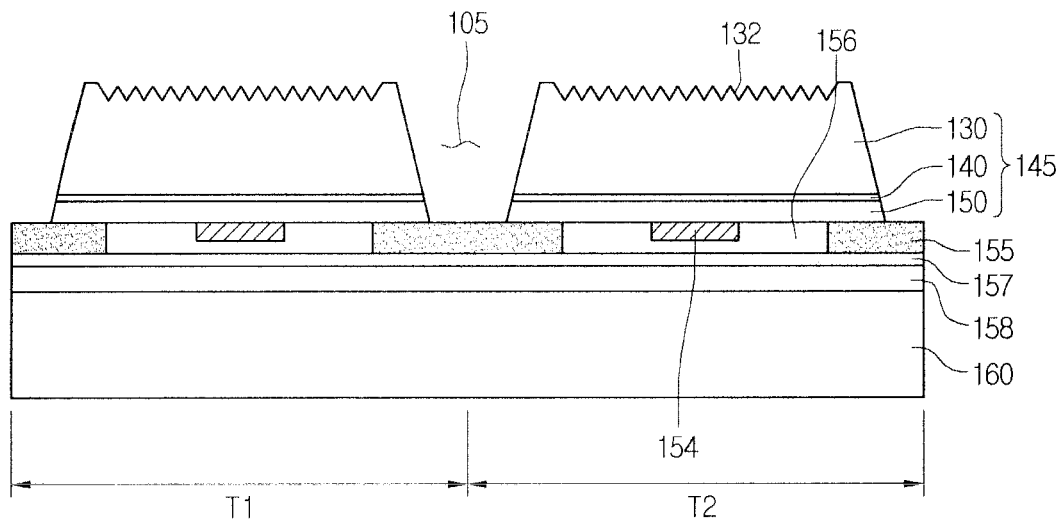

Referring to FIG. 7, an isolation etching process is performed along the boundary region between the first and second chip regions T1 and T2 to separate a unit chip region including the light emitting structure 145. The protection layer 155 of a boundary region 105 between the first and second chip regions T1 and T2 may be exposed through the isolation etching process.

The lateral surface of the light emitting structure 145 may be inclined through the isolating etching process.

Simultaneously, the roughness structure 132 may be formed on the top surface of the light emitting structure 145, that is, the top surface of the second conductive semiconductor layer 130.

The isolating etching process may include a dry etching process such as ICP (Inductively Coupled Plasma).

The roughness structure 132 may have a random pattern through a wet etching process, or may have a photonic crystal structure according to a mask pattern, but the embodiment is not limited thereto.

Figure 8:
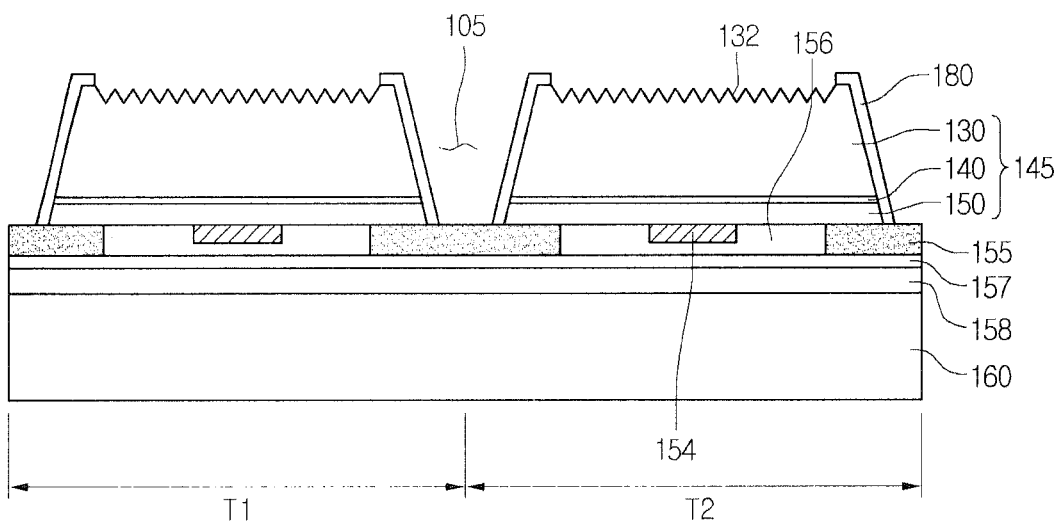

Referring to FIG. 8, the passivation layer 180 may be formed on at least a lateral surface of the light emitting structure 145, and on the protection layer 155 between the first and second chip regions T1 and T2. In other words, the passivation layer 180 contacts a top surface of the protection layer of the boundary region 105 between the first and second chip regions T1 and T2. The passivation layer 180 may extend to an outer peripheral portion of the top surface of the second conductive semiconductor layer 130 by passing or crossing through the first conductive semiconductor layer 150, the active layer 140, and the second conductive semiconductor layer 130.

The passivation layer 180 prevents the light emitting structure 145 from being electrically shorted with a conductive support member such as an external electrode. The passivation layer 180 may include an insulating material including $SiO_2$, $SiO_x$, $SiO_xN_y$, $Si_3N_4$, $TiO_2$, or $Al_2O_3$, but the embodiment is not limited thereto.

The passivation layer 180 may be formed through various deposition processes such as an E-beam deposition scheme, and a PECVD scheme or a sputtering scheme.

The roughness structure 132 may be formed on the top surface of the second conductive semiconductor layer 130 by using the passivation layer 180 as a mask after the passivation layer 180 has been formed.

In other words, the roughness structure 132 may be formed before the passivation layer 180 is formed, or after the passivation layer 180 has been formed.

Figure 9:
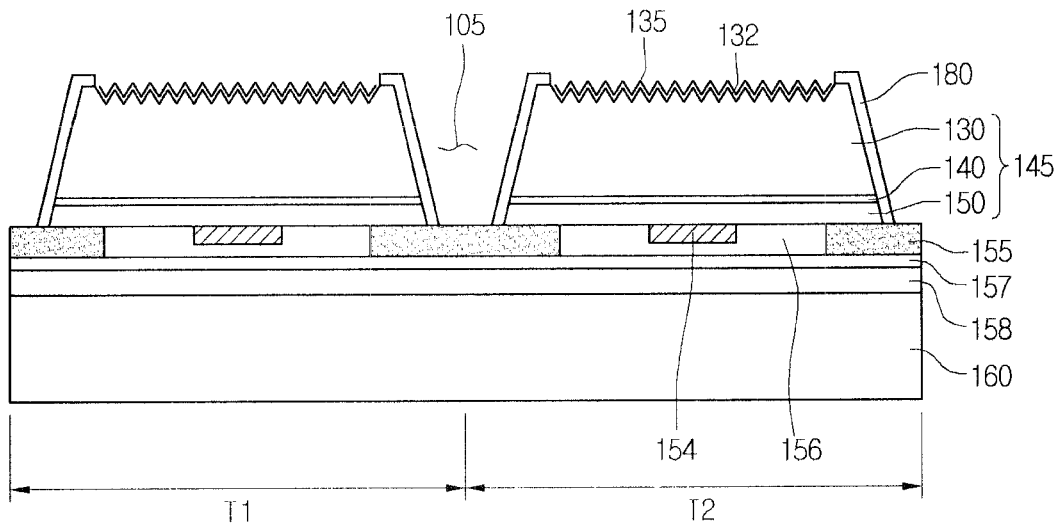

Referring to FIG. 9, the nano-tube layer 135 may be formed on the top surface of the light emitting structure 145, that is, the second conductive semiconductor layer 130.

The nano-tube layer 135 may be formed through a coating scheme such as a spin coating scheme or a dip coating scheme, or may be prepared in the form of a film and attached to the light emitting structure 145. However, the embodiment is not limited thereto.

The nano-tube layer 135 may be selectively formed on the top surface of the second conductive semiconductor layer 130. For example, the nano-tube layer 135 may be formed on the whole region of the second conductive semiconductor layer 130 or on a region having an area corresponding to at least 70% of an area of the second conductive semiconductor layer 130.

Figure 10:
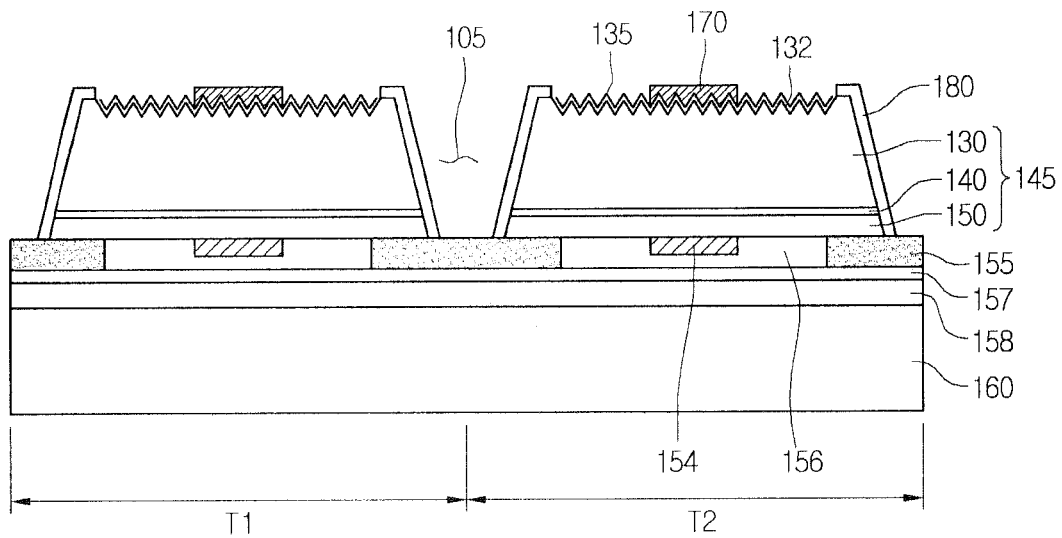

Referring to FIG. 10, the second electrode 170 may be formed on the nano-tube layer 135. The second electrode 170 may be plated or deposited.

Figure 11:
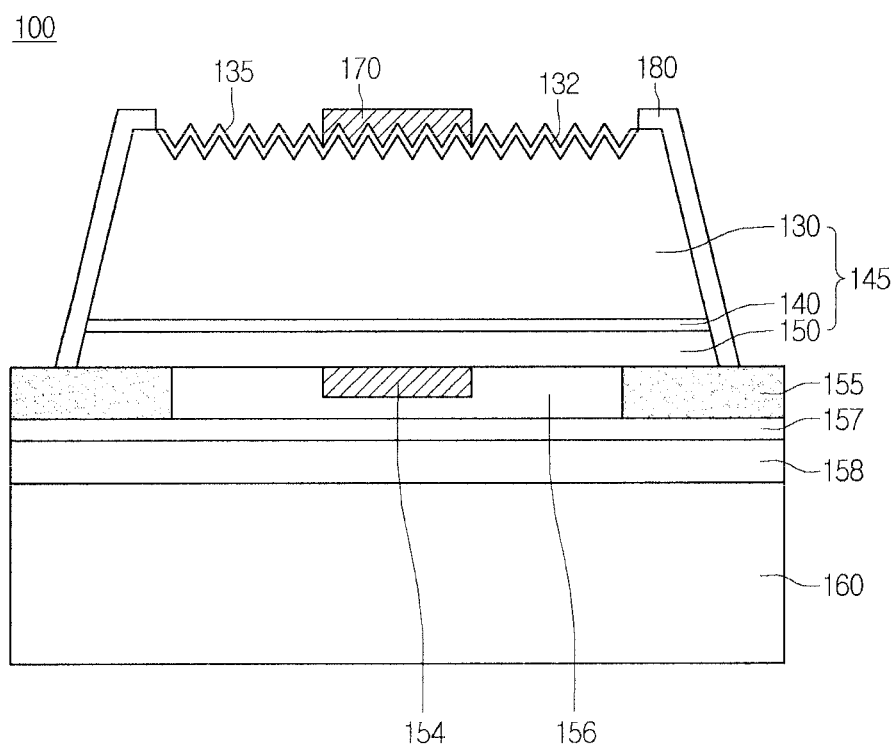

Referring to FIG. 11, a chip separation process is performed to cut the boundary region between the first and second chip regions T1 and T2, thereby dividing a plurality of chips into the unit of an individual chip. Accordingly, the light emitting device 100 according to the embodiment can be manufactured.

The chip separation process may include a breaking process to divide chips by apply physical force using a blade, a laser scribing process to divide chips by irradiating a laser beam into a chip boundary region, and an etching process including a wet etching process or a dry etching process, but the embodiment is not limited thereto.

Figure 12:
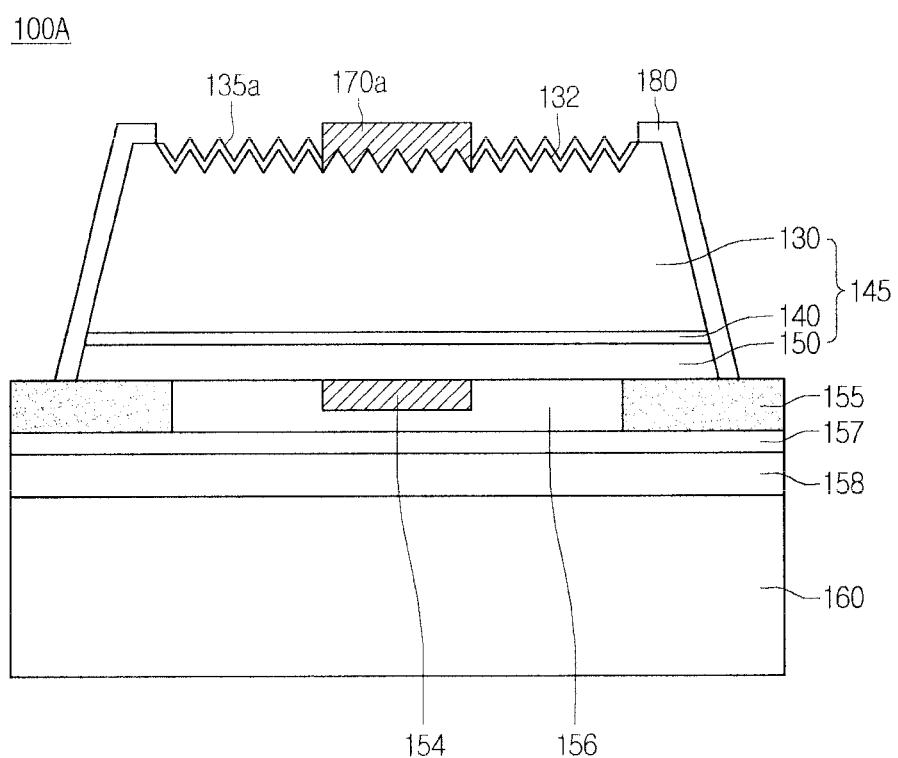
FIG. 12 is a side sectional view showing a light emitting device according to a second embodiment.

FIG. 12 is a side sectional view showing a light emitting device 100A according to a second embodiment.

The light emitting device 100A according to the second embodiment has the same structure as that of the first embodiment except for the shape of the nano-tube layer. Accordingly, the same reference numbers will be assigned to elements of the second embodiment identical to those of the first embodiment, and the details thereof will be omitted.

Referring to FIG. 12, the light emitting device 100 according to the second embodiment includes the first electrode 160, the adhesive layer 158 on the first electrode 160, the reflective layer 157 on the adhesive layer 158, the protection layer 155 on an outer peripheral portion of the top surface of the reflective layer 157, the ohmic contact layer 156 on the reflective layer 157, the light emitting structure 145 formed on the ohmic contact layer 156 and the protection layer 155 to generate light, a nano-tube layer 135a selectively formed on the top surface of the light emitting structure 145, the passivation layer 180 on a lateral surface of the light emitting structure 145, and a second electrode 170a on the light emitting structure 145.

The second electrode 170a may directly contacts the top surface of the light emitting structure 145, that is, the top surface of the second conductive semiconductor layer 130.

To this end, after the nano-tube layer 135a corresponding to the region for the second electrode 170a is selectively removed, the second electrode 170a is formed at the removed region of the nano-tube layer 135a such that the second electrode 170a directly contacts the second conductive semiconductor layer 130.

After the second electrode 170a has been formed on the second conductive semiconductor layer 130, the nano-tube layer 135a may be formed by using a mask on the second conductive semiconductor layer 130 around the second electrode 170a, but the embodiment is not limited thereto. In other words, the second electrode 170a is surrounded by the nano-tube layer 135a.

Figure 13:
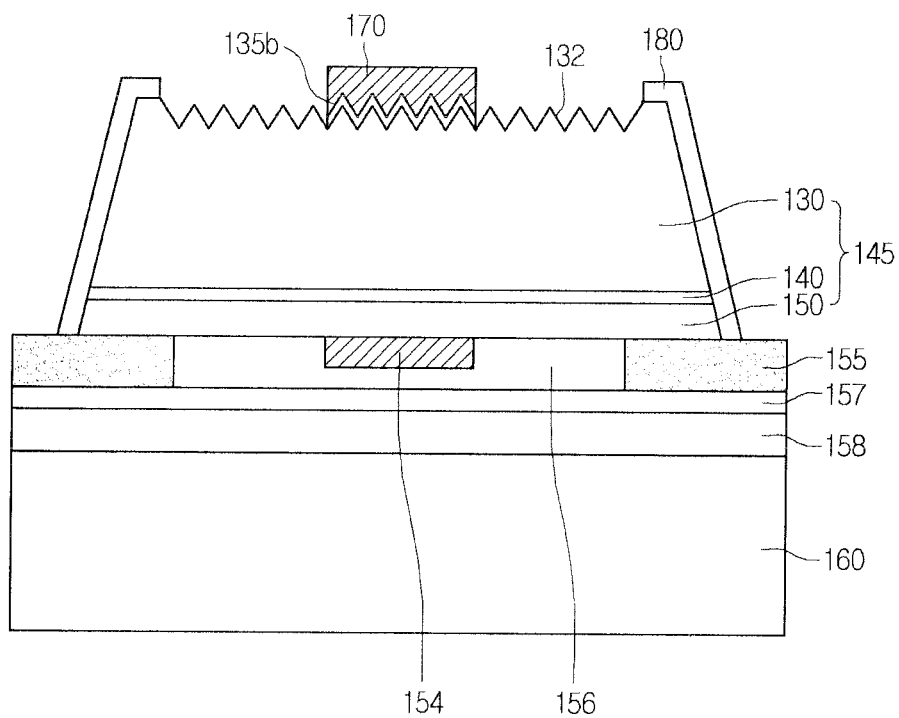
FIG. 13 is a side sectional view showing a light emitting device according to a third embodiment.

FIG. 13 is a side sectional view showing a light emitting device 100B according to a third embodiment.

The light emitting device 100B according to the third embodiment has the same structure as that of the first embodiment except for the shape of the nano-tube layer. Accordingly, the same reference numbers will be assigned to elements of the third embodiment identical to those of the first embodiment, and the details thereof will be omitted.

Referring to FIG. 13, the light emitting device 100B according to the third embodiment includes the first electrode 160, the adhesive layer 158 on the first electrode 160, the reflective layer 157 on the adhesive layer 158, the protection layer 155 on an outer peripheral portion of the top surface of the reflective layer 157, the ohmic contact layer 156 on the reflective layer 157, the light emitting structure 145 formed on the ohmic contact layer 156 and the protection layer 155 to generate light, a nano-tube layer 135b selectively formed on the top surface of the light emitting structure 145, the passivation layer 180 on the lateral surface of the light emitting structure 145, and the second electrode 170 on the nano-tube layer 135b.

The nano-tube layer 135b may be formed at a region between the second electrode 170 and the second conductive semiconductor layer 130 in order to reduce the contact resistance between the second electrode 170 and the second conductive semiconductor layer 130. In other words, the nano-tube layer 135b may have the same area as that of the second electrode 170.

To this end, after patterning the nano-tube layer 135b, the second electrode 170 may be formed only on the nano-tube layer 135b.

After the nano-tube layer 135b and the second electrode 170 are subsequently formed, the second electrode 170 and the nano-tube layer 135b are sequentially and selectively removed, so that the second electrode 170 and the nano-tube layer 135b having the same size and the same pattern may be formed.

Figure 14:
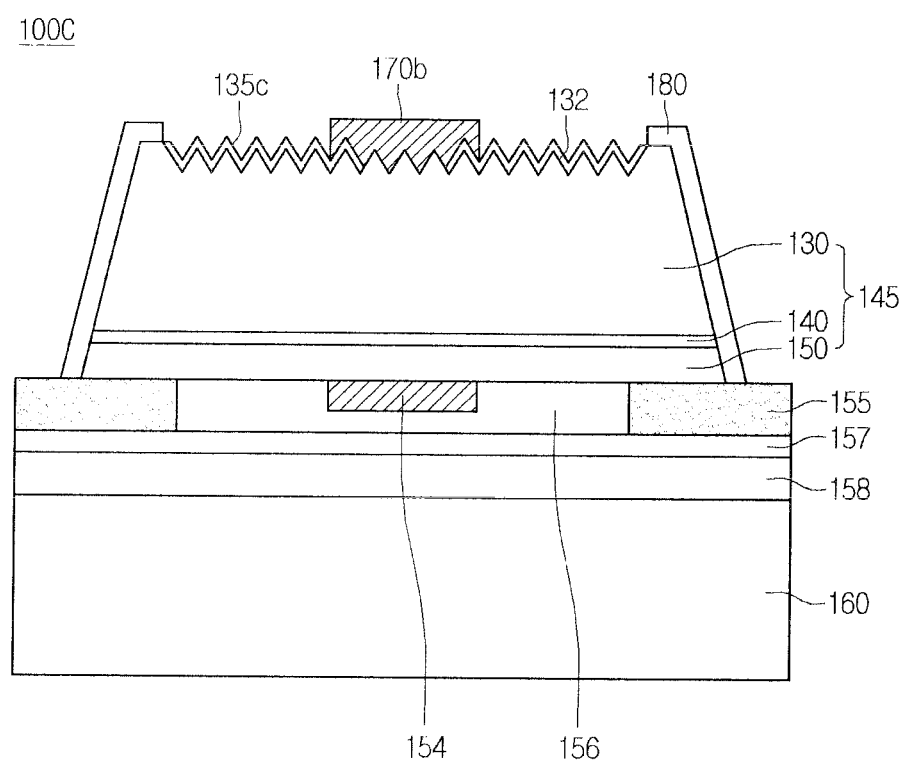
FIG. 14 is a side sectional view showing a light emitting device according to a fourth embodiment.

FIG. 14 is a side sectional view showing a light emitting device 100C according to a fourth embodiment.

The light emitting device 100C according to the fourth embodiment has the same structure as that of the first embodiment except that a second electrode 170b is formed on the second conductive semiconductor layer 130 and a nano-tube layer 135c. Accordingly, the same reference numbers will be assigned to elements of the fourth identical to those of the first embodiment, and the details thereof will be omitted.

Referring to FIG. 14, in the light emitting device 100C according to the fourth embodiment, a bottom surface of the second electrode 170b may contact both of the second conductive semiconductor layer 130 and the nano-tube layer 135c.

To this end, a part of the nano-tube layer 135c may be removed to expose the second conductive semiconductor layer 130. The second electrode 170b passes through the nano-tube layer 135c such that the second electrode 170b overlaps with a part of the nano-tube layer 135c.

The second electrode 170b contacts the second conductive semiconductor layer 130, and passes through the nano-tube layer 135c to extend from the second conductive semiconductor layer 130 to a top surface of the nano-tube layer 135c. In addition, the second electrode 170b may be formed at a part of the nano-tube layer 135c to overlap with a part of the nano-tube layer 135c.

Figure 15:
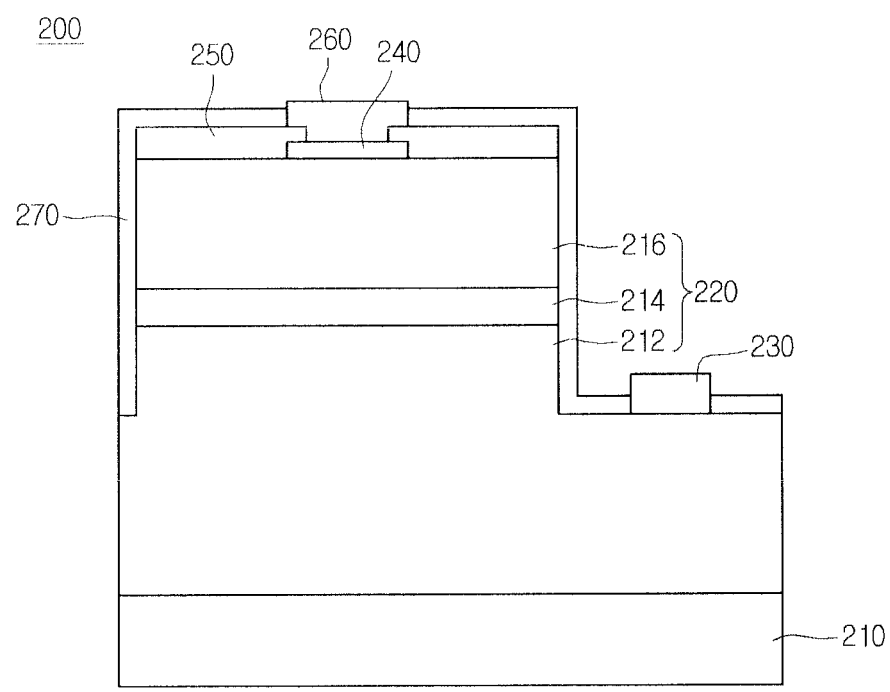
FIG. 15 is a side sectional view showing a light emitting device according to a fifth embodiment.

FIG. 15 is a side sectional view showing a light emitting device 200 according to a fifth embodiment.

Referring to FIG. 15, the light emitting device 200 according to the fifth embodiment includes a growth substrate 210, a light emitting structure 220 including a first conductive semiconductor layer 212, an active layer 214, and a second conductive semiconductor layer 216 on the growth substrate 210, a first electrode 230 on the first conductive semiconductor layer 212, a transparent electrode 250 on the second conductive semiconductor layer 216, a second electrode 260 on the nano tube layer 250, and a passivation layer 270 at an outer peripheral portion of at least the light emitting structure 220.

The growth substrate 210 may include at least one of sapphire ($Al_2O_3$), SiC, Si, GaAs, GaN, ZnO, Si, GaP, InP, and Ge.

The light emitting structure 220 may include compound semiconductor materials of group III to V elements.

The first conductive semiconductor layer 212 may include an N type semiconductor layer doped with an N type dopant, and the second conductive semiconductor layer 216 may include a P type semiconductor layer doped with a P type dopant, but the embodiment is not limited thereto.

The nano tube layer 250 may be formed on the second conductive semiconductor layer 216.

The nano tube layer 250 spreads current supplied from the second electrode 260 such that the current can be supplied to the whole region of the second conductive semiconductor layer 216.

The second electrode 260 may extends from the second conductive semiconductor layer 216 while passing through the nano tube layer 250.

In this case, the quantity of current supplied to the second conductive semiconductor layer 216 directly contacting the second electrode 260 is greater than the quantity of current supplied to the second conductive semiconductor layer 216 through the nano tube layer 250. Accordingly, light is uniformly emitted from the whole region of the active layer 214.

Accordingly, a CBL 240 may be formed on the second conductive semiconductor layer 216 directly contacting the second electrode 260. The CBL 240 has a size greater than the areas of at least two second electrodes 160. The current blocking layer has a size greater than a size of an area of a bottom of the second electrode. The current supplied from the second electrode 260 may be supplied at the minimum of quantity through to the CBL 140 or may not be supplied at all due to the CBL 240. In contrast, after the current supplied from the second electrode 260 has been spread through the transparent electrode 250, the current may be uniformly supplied to the second conductive semiconductor layer 216. Accordingly, the uniform light is emitted from the active layer 214 so that the light emission efficiency of the light emitting device 200 can be improved.

The passivation layer 270 may be formed at an outer peripheral portion of the light emitting structure 220 except for the first and second electrodes 230 and 260. For example, the passivation layer 270 may be formed on an outer peripheral portion of the lateral surface of the first conductive semiconductor layer 212, an outer peripheral portion of the lateral surface of the active layer 214, an outer peripheral portion of the second conductive semiconductor layer 215 and the top surface of the second conductive semiconductor layer 215.

The passivation layer 270 may include an insulating material including $SiO_2$, $SiO_x$, $SiO_xN_y$, $Si_3N_4$, $TiO2$, or $Al_2O_3$, but the embodiment is not limited thereto.

Although not shown, the transparent electrode 250 is not formed in a through hole formed by the second electrode 260, but may be formed on the CBL in such a manner that the transparent electrode 250 covers at least the whole region of the CBL. In other words, after forming the nano tube layer to cover the whole region of the CBL, the second electrode may be formed on the transparent electrode corresponding to the CBL. The CBL may be formed between the transparent electrode corresponding to the second electrode and the second semiconductor layer. Accordingly, the second electrode does not contact the CBL.

Although not shown, a roughness structure may be formed on the second conductive semiconductor layer 216.

Figure 16:
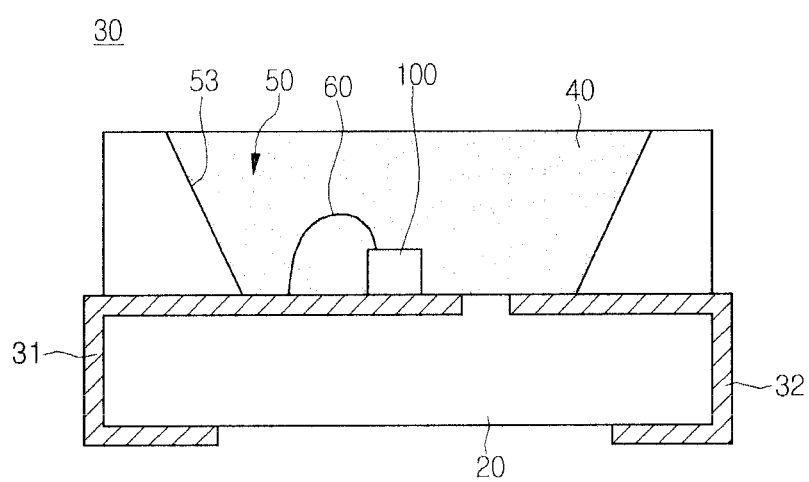
FIG. 16 is a side sectional view showing a light emitting device package including the light emitting device according to the embodiment.

FIG. 16 is a light emitting device package 30 including the light emitting device according to the embodiment.

Referring to FIG. 16, the light emitting device package 30 includes a body 20, first and second electrode layers 31 and 32 installed in the body 20, the light emitting device 100 provided on the body 20 and electrically connected to the first and second electrode layers 31 and 32, and a molding member 40 that surrounds the light emitting device 100 on the body 20.

The body 20 may include silicon, synthetic resin or metallic material. When viewed from the top, the body 20 has a cavity having an open upper portion and formed with an inclined inner wall.

The first and second electrode layers 31 and 32 are electrically isolated from each other and pass through the body 20. In detail, one ends of the first and second electrode layers 31 and 32 are disposed in the cavity 50 and the other ends of the first and second electrode layers 31 and 32 are attached to an outer surface of the body 20 and exposed to the outside.

The first and second electrode layers 31 and 32 supply power to the light emitting device 100 and improve the light efficiency by reflecting the light emitted from the light emitting device 100. Further, the first and second electrode layers 31 and 32 dissipate heat generated from the light emitting device 100 to the outside.

The light emitting device 100 can be installed on the body 20 or the first or second electrode layer 31 or 32.

The wire 60 of the light emitting device 100 may be electrically connected to one of the first and second electrode layers 31 and 32, but the embodiment is not limited thereto. In this case, the electrode layer that is not connected to the wire 60 may be electrically connected to the rear surface of the light emitting device 100.

The molding member 40 surrounds the light emitting device 100 to protect the light emitting device 100. In addition, the molding member 40 may include luminescence material to change the wavelength of the light emitted from the light emitting device 100 by the luminescence material.

Figure 17:
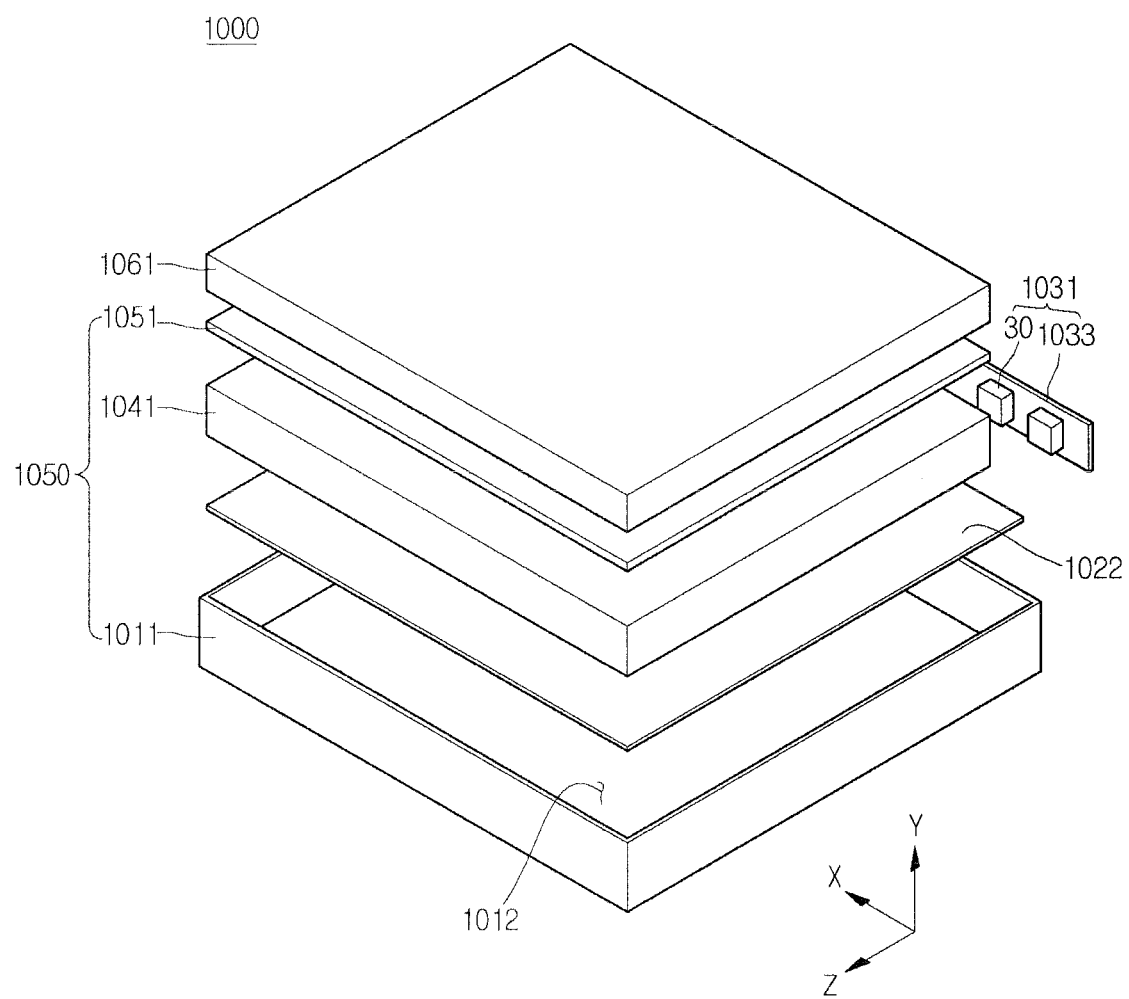
FIG. 17 is an exploded perspective view showing a display apparatus according to the embodiment.
Figure 18:
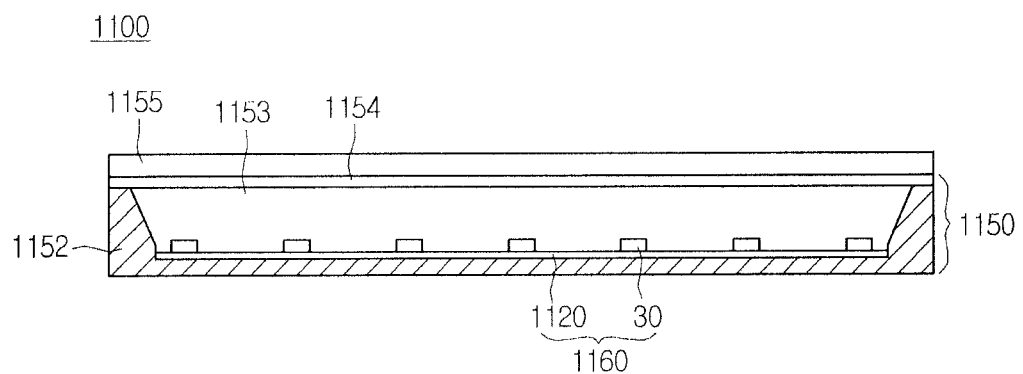
FIG. 18 is a view showing the display apparatus according to the embodiment.
Figure 19:
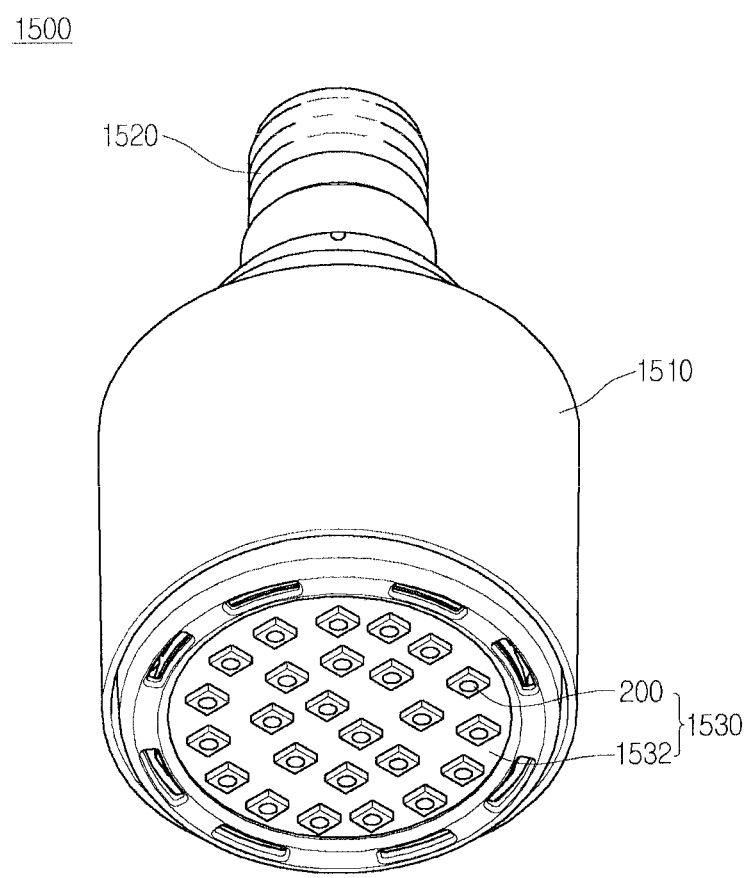
FIG. 19 is a perspective view showing a lighting apparatus according to the embodiment.

The light emitting device or the light emitting device package according to the embodiment may be applied to the light unit. The light unit has an array structure of a plurality of light emitting devices or a plurality of light emitting device packages. The light unit may include the display device as shown in FIGS. 17 and 18 and the lighting device as shown in FIG. 19. In addition, the light unit may include a lighting lamp, a signal lamp, a headlight of a vehicle, and an electric signboard.

FIG. 17 is an exploded perspective view showing the display apparatus according to the embodiment.

Referring to FIG. 17, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially contacts the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which travels downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 18 is a sectional view showing a display apparatus according to the embodiment.

Referring to FIG. 18, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit (not shown).

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 19 is a perspective view showing a lighting apparatus according to the embodiment.

Referring to FIG. 19, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the method of manufacturing the light emitting device includes the steps of preparing a first electrode including a conductive support member, forming a light emitting structure including a first semiconductor layer, an active, and a second semiconductor layer on the first electrode, forming a nano-tube layer including a plurality of carbon nano tubes on the light emitting structure; and forming a second electrode on the light emitting structure.

According to the embodiment, the nano tube layer is formed on the light emitting structure to uniformly spread current, thereby preventing current from being centralized. Accordingly, the light emission efficiency of the light emitting device can be improved.

According to the embodiment, the nano-tube layer is formed on the light emitting structure, so that heat emitted from the light emitting structure can be rapidly dissipated through the nano-tube layer.

According to the embodiment, a nano-tube layer having a refractive index less than that of the light emitting structure is formed, so that the light extraction efficiency of the light emitting device can be improved due to the refractive index difference between the light emitting structure and the nano-tube layer.

According to the embodiment, a nano-tube layer is formed between the light emitting structure and the electrode so that the contact resistance between the light emitting structure and the electrode can be reduced. Accordingly, current supplied to the electrode can more smoothly flow to the light emitting structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a light emitting structure on the substrate and including a first semiconductor layer, an active layer on the first semiconductor layer, and a second semiconductor layer on the active layer;
   a first electrode electrically connected to the first semiconductor layer;
   a nano-tube layer on the second semiconductor layer;
   a current blocking layer between the second semiconductor layer and the nano-tube layer; and
   a second electrode on the nano-tube layer,
   wherein the nano-tube layer includes a through-hole,
   wherein a portion of the second electrode is disposed in the through-hole,
   wherein a portion of the nano-tube layer is disposed between the current blocking layer and the second electrode,
   wherein the portion of the nano-tube layer disposed between the current blocking layer and the second electrode contacts a top surface of the current blocking layer, and
   wherein the second electrode contacts a portion of the current blocking layer and the portion of the nano-tube layer.

2. The light emitting device of claim 1, wherein the current blocking layer is disposed in the through-hole.

3. The light emitting device of claim 1, wherein the top surface of the current blocking layer is higher than a bottom surface of the nano-tube layer.

4. The light emitting device of claim 1, further comprising a passivation layer that surrounds the light emitting structure.

5. The light emitting device of claim 4, wherein the passivation layer is formed on an outer peripheral portion of the lateral surface of the first conductive semiconductor layer.

6. The light emitting device of claim 5, wherein the passivation layer is formed on an outer peripheral portion of the lateral surface of the active layer.

7. The light emitting device of claim 6, wherein the passivation layer is formed on an outer peripheral portion of the second conductive semiconductor layer.

8. The light emitting device of claim 7, wherein the passivation layer is formed on a top surface of the second conductive semiconductor layer.

9. The light emitting device of claim 1, wherein the nano-tube layer has a refractive index lower than a refractive index of the light emitting structure.

10. The light emitting device of claim 1, further comprising a roughness structure disposed on the second conductive semiconductor.

11. The light emitting device of claim 1, wherein the current blocking layer has a size greater than an area of a bottom of the second electrode.

12. The light emitting device package including the light emitting device of claim 1, and further including a package body provided to house the light emitting device.

13. A lighting system including a light emitting module portion including the light emitting device package of claim 12.

* * * * *